United States Patent
Rich et al.

(10) Patent No.: US 7,412,638 B2
(45) Date of Patent: *Aug. 12, 2008

(54) METHOD, SYSTEM, AND PROGRAM PRODUCT FOR CONTROLLING TEST DATA OF A LOGIC BUILT-IN SELF-TEST OF AN INTEGRATED CIRCUIT

(75) Inventors: Marvin J. Rich, Poughkeepsie, NY (US); Jay R. Herring, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/762,889

(22) Filed: Jun. 14, 2007

(65) Prior Publication Data

US 2007/0240025 A1      Oct. 11, 2007

Related U.S. Application Data

(63) Continuation of application No. 10/980,938, filed on Nov. 4, 2004, now Pat. No. 7,272,761.

(51) Int. Cl.
  *G01R 31/28* (2006.01)
(52) U.S. Cl. .................. 714/733; 714/726; 714/732
(58) Field of Classification Search .......... None
  See application file for complete search history.

(56) References Cited

U.S. PATENT DOCUMENTS

| | | | |
|---|---|---|---|
| 5,570,375 A | 10/1996 | Tsai et al. | |
| 5,907,562 A | 5/1999 | Wrape et al. | |
| 6,195,775 B1 | 2/2001 | Douskey et al. | |
| 6,327,685 B1 | 12/2001 | Koprowski et al. | |
| 6,442,723 B1 | 8/2002 | Koprowski et al. | |
| 6,516,432 B1 | 2/2003 | Motika et al. | |
| 6,622,273 B1 | 9/2003 | Barnes | |
| 6,654,920 B1 | 11/2003 | Hetherington et al. | |

(Continued)

OTHER PUBLICATIONS

T.K. Jaber et al., "Build-In Self-Test Architecture", IBM Technical Disclosure Bulletin, vol. 32, No. 12, pp. 448-451 (May 1990).

*Primary Examiner*—Christine T Tu
(74) *Attorney, Agent, or Firm*—John E. Campbell, Esq.; Kevin P. Radigan, Esq.; Heslin Rothenberg Farley & Mesiti P.C.

(57) ABSTRACT

A method of controlling test data with a boundary latch module having a plurality of latches to facilitate logic built-in self-testing of an integrated circuit (IC) is provided which includes providing a plurality of selection devices for selecting initialization data to store in the plurality of latches of the IC's boundary latch module. The initialization data is selected from a plurality of scan paths of the integrated circuit, and the initialization data from at least one of the latches is provided as input to a logic circuit of the IC or output of the IC. In another aspect, the method includes selecting a datum from an external input or test-pattern generator of the integrated circuit for capture in at least one of the latches and input to a multiple-input signature register, which stores a signature of the integrated circuit resulting from the logic built-in self-testing.

15 Claims, 10 Drawing Sheets

U.S. PATENT DOCUMENTS

| | | |
|---|---|---|
| 6,671,838 B1 | 12/2003 | Koprowski et al. |
| 6,671,841 B1 | 12/2003 | Golshan |
| 6,708,305 B1 | 3/2004 | Farnsworth et al. |
| 6,715,105 B1 | 3/2004 | Rearick |
| 6,734,549 B2 | 5/2004 | Takeoka et al. |
| 6,754,867 B2 * | 6/2004 | Ojha et al. .................. 714/739 |
| 6,760,873 B1 * | 7/2004 | Hao et al. .................... 714/724 |
| 2003/0074620 A1 | 4/2003 | Dorsey |

* cited by examiner

REGULAR | OPTIMIZED

CARD 1 (Regular)
| | | | | | |
|---|---|---|---|---|---|
| BOARD ID REG (ALL CHIPS) | 1 | 0 | 0 | 0 | 0 |
| CARD ID REG (CHIP 0) | 1 | 0 | 0 | 0 | 0 |
| CARD ID REG (CHIP 1) | 0 | 1 | 0 | 0 | 0 |

CARD 1 (Optimized)
| | | | | | |
|---|---|---|---|---|---|
| BOARD ID REG (ALL CHIPS) | 1 | 0 | 0 | 0 | 0 |
| CARD ID REG (CHIP 0) | 1 | 0 | 1 | 0 | 1 |
| CARD ID REG (CHIP 1) | 0 | 1 | 0 | 1 | 0 |

CARD 2 (Regular)
| | | | | | |
|---|---|---|---|---|---|
| BOARD ID REG (ALL CHIPS) | 0 | 1 | 0 | 0 | 0 |
| CARD ID REG (CHIP 2) | 1 | 0 | 0 | 0 | 0 |
| CARD ID REG (CHIP 3) | 0 | 1 | 0 | 0 | 0 |
| CARD ID REG (CHIP 4) | 0 | 0 | 1 | 0 | 0 |
| CARD ID REG (CHIP 5) | 0 | 0 | 0 | 1 | 0 |

CARD 2 (Optimized)
| | | | | | |
|---|---|---|---|---|---|
| BOARD ID REG (ALL CHIPS) | 0 | 1 | 0 | 1 | 0 |
| CARD ID REG (CHIP 2) | 1 | 0 | 0 | 0 | 1 |
| CARD ID REG (CHIP 3) | 0 | 1 | 0 | 0 | 0 |
| CARD ID REG (CHIP 4) | 0 | 0 | 1 | 0 | 0 |
| CARD ID REG (CHIP 5) | 0 | 0 | 0 | 1 | 0 |

CARD 3 (Regular)
| | | | | | |
|---|---|---|---|---|---|
| BOARD ID REG (ALL CHIPS) | 0 | 0 | 1 | 0 | 0 |
| CARD ID REG (CHIP 6) | 1 | 0 | 0 | 0 | 0 |
| CARD ID REG (CHIP 7) | 0 | 1 | 0 | 0 | 0 |
| CARD ID REG (CHIP 8) | 0 | 0 | 1 | 0 | 0 |
| CARD ID REG (CHIP 9) | 0 | 0 | 0 | 1 | 0 |
| CARD ID REG (CHIP 10) | 0 | 0 | 0 | 0 | 1 |

CARD 3 (Optimized)
| | | | | | |
|---|---|---|---|---|---|
| BOARD ID REG (ALL CHIPS) | 0 | 0 | 1 | 0 | 1 |
| CARD ID REG (CHIP 6) | 1 | 0 | 0 | 0 | 0 |
| CARD ID REG (CHIP 7) | 0 | 1 | 0 | 1 | 0 |
| CARD ID REG (CHIP 8) | 0 | 0 | 1 | 0 | 1 |
| CARD ID REG (CHIP 9) | 0 | 1 | 0 | 1 | 0 |
| CARD ID REG (CHIP 10) | 0 | 0 | 1 | 0 | 1 |

CARD 4 (Regular)
| | | | | | |
|---|---|---|---|---|---|
| BOARD ID REG (ALL CHIPS) | 0 | 0 | 0 | 1 | 0 |
| CARD ID REG (CHIP 0) | 1 | 0 | 0 | 0 | 0 |
| CARD ID REG (CHIP 1) | 0 | 1 | 0 | 0 | 0 |

CARD 4 (Optimized)
| | | | | | |
|---|---|---|---|---|---|
| BOARD ID REG (ALL CHIPS) | 1 | 0 | 0 | 0 | 0 |
| CARD ID REG (CHIP 0) | 1 | 0 | 1 | 0 | 1 |
| CARD ID REG (CHIP 1) | 0 | 1 | 0 | 1 | 0 |

*fig. 6*

METHOD, SYSTEM, AND PROGRAM PRODUCT FOR CONTROLLING TEST DATA OF A LOGIC BUILT-IN SELF-TEST OF AN INTEGRATED CIRCUIT

CROSS-REFERENCE TO RELATED APPLICATIONS

This application is a continuation of co-pending U.S. patent application Ser. No. 10/980,938, filed Nov. 4, 2004, and published May 18, 2006 as U.S. Patent Publication No. US 2006/0107149 A1, entitled "Method, System, and Program Product for Controlling Test Data of a Logic Built-In Self-Test of an Integrated Circuit", by Rich et al., the entirety of which is hereby incorporated herein by reference. Further, this application contains subject matter which is related to the subject matter of U.S. patent application Ser. No. 10/981,225, filed Nov. 4, 2004, and published on May 4, 2006 as U.S. Patent Publication No. 2006/0095820 A1, entitled "Method, System, and Program Product for Boundary I/O Testing Employing a Logic Built-In Self-Test of an Integrated Circuit", by Rich et al., and which is assigned to the same assignee as this application, and which is hereby incorporated herein by reference in its entirety.

TECHNICAL FIELD

This invention relates in general to testing integrated circuits and, more particularly, to a technique for boundary input/output testing of an integrated circuit within a logic built-in self-test of the integrated circuit.

BACKGROUND OF THE INVENTION

With the increased complexity and density of today's high-end application-specific integrated circuit (ASIC) chips and higher-level electronic packages, there is a corresponding increase in the time required to verify the functionality of these complex package combinations. Typically, multiple independent logic built-in self-test (LBIST) runs are needed to verify the internal logic of multiple chips of an electronic package. If the electronic package has arrays, multiple array built-in self-test (ABIST) runs may also be executed as a separate step. In order to guarantee predictability for LBIST tests, the inputs to each chip are conventionally inhibited at the boundary logic. Subsequently, a second set of tests is performed to check input/output (I/O) connections at chip boundaries (e.g., reference IEEE Std 1149.1 Boundary Scan). These tests are typically DC-type tests, which verify that each I/O connection does not have a stuck fault, i.e., the I/O connection is not stuck at logic-level 0 or 1.

In order to perform the boundary scan tests, detailed information is required about the interconnections of each chip in the electronic package environment. For example, each I/O source, I/O sink, and I/O enable control path must be identified for boundary scan initialization and validation. Since the test topology set-up is typically remotely performed, with scan operations being transported to the hardware through a serial service processor interface such as JTAG, there is additional overhead introduced by performing these tests. Therefore, there exists a need in the art to further facilitate performing boundary scan checks, and there is a need to reduce the complexity of maintaining I/O connection information for multiple-chip electronic package configurations on a service processor. There is also a need to provide I/O boundary checking capability on less sophisticated hardware platforms that do not have service processor attachments.

SUMMARY OF THE INVENTION

The shortcomings of the prior art are overcome and additional advantages are provided through the provision of a method of controlling test data with a boundary latch module having a plurality of latches to facilitate logic built-in self-testing of an integrated circuit. In one aspect, the method includes providing a plurality of selection devices for selecting initialization data to store in the plurality of latches of the boundary latch module of the integrated circuit. The plurality of selection devices are utilized to select initialization data from a plurality of scan paths of the integrated circuit, and the initialization data from at least one of the plurality of latches is provided as at least one input to a logic circuit of the integrated circuit or at least one output of the integrated circuit.

In other aspects, the method includes: providing another selection device for selecting an external datum provided by an external input to the integrated circuit or a test-pattern datum from test-pattern generator logic of the integrated circuit; utilizing the another selection device to select the external datum or the test-pattern datum as a datum for capture in at least one of the plurality of latches; and providing the datum captured by the at least one of the plurality of latches as at least one input to a multiple-input signature register, which stores a signature of the integrated circuit resulting from the logic built-in self-testing.

Further, the method can include providing a drive-enable control signal to the boundary latch module to enable the boundary latch module to drive an output pin of the integrated circuit. In yet another aspect, the method can include capturing the drive-enable control signal in at least one of the plurality of latches of the boundary latch module and providing the drive-enable control signal as at least one input to a multiple-input signature register.

Systems and computer program products corresponding to the above-summarized methods are also described and claimed herein.

Additional features and advantages are realized through the techniques of the present invention. Other embodiments and aspects of the invention are described in detail herein and are considered a part of the claimed invention.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIG. 6 illustrates identification register settings for two exemplary test configurations of integrated circuits in the electronic package environment of FIG. 5, in accordance with an aspect of the present invention;

BEST MODE FOR CARRYING OUT THE INVENTION

Generally stated, in one aspect, presented herein is the verification of input/output circuits of an integrated circuit being integrated within a logic built-in self-test (LBIST) of the integrated circuit. Such verification of input/output circuits is provided by enabling the input/output (I/O) circuits at the boundary scan latches so that I/O data to other chips is received by those other chips, which are concurrently conducting logic built-in self-tests, and that output data sent by those other chips is received by the integrated circuit. In other words, the verification of I/O circuits is integrated within LBIST testing by configuring the I/O circuits of chips involved in the test to be concurrently uninhibited, rather than inhibiting I/O circuits at the boundary logic of each chip during self-test as is the conventional approach.

Figure 1:
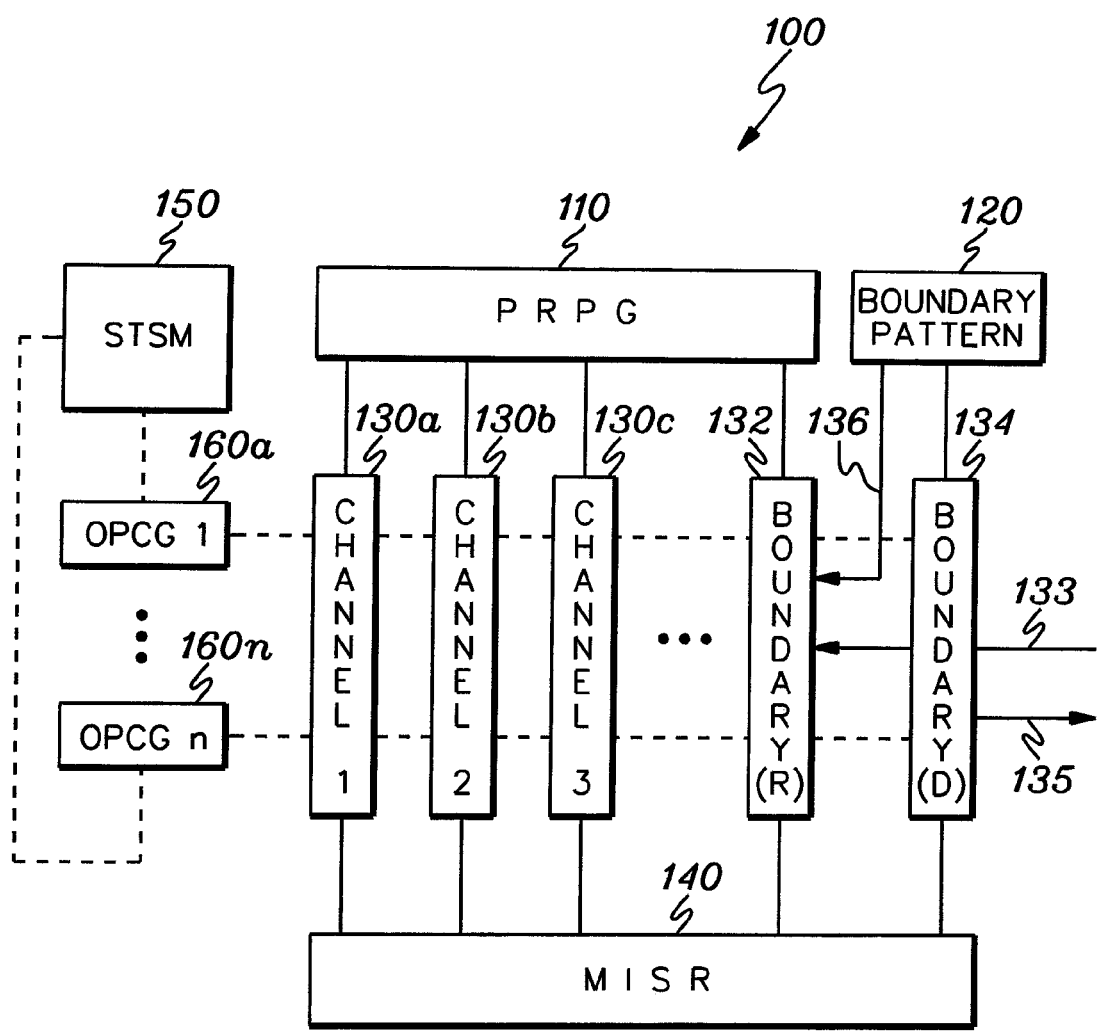
FIG. 1 illustrates one partial embodiment of an integrated circuit with a logic built-in self-test and integrated boundary input/output testing, in accordance with an aspect of the present invention.

FIG. 1 illustrates one embodiment of a logic built-in self-test circuitry with integrated boundary input/output testing, in accordance with an aspect of the present invention. Logic built-in self-test circuit 100 includes pseudo-random test pattern generator (PRPG) 110, scan channels 130a, 130b, and 130c, boundary scan receiver channel 132, boundary test pattern generator 120, boundary scan driver channel 134, multiple-input signature register (MISR) 140, self-test state machine (STSM) 150, and on-product clock generators (OPCG) 160a through 160n.

Each scan channel 130a, 130b, 130c and boundary scan receiver channel 132 is driven with a pseudo-random test pattern from pseudo-random test-pattern generator 110 during the scan initialization phase of an LBIST iteration. Boundary scan receiver channel 132 can select external input 133 to provide test data for an input circuit of the integrated circuit. Alternatively, boundary scan receiver channel 132 can select internal input 136 to provide test data from boundary test pattern generator 120. Each instance of a boundary scan receiver channel selects an external input or an internal input from boundary test pattern generator 120 based on an integrated circuit's particular requirements. In one implementation, boundary scan driver channel 134 is driven by a deterministic test pattern generated by boundary test pattern generator 120, and boundary scan driver channel 134 drives output line 135 of the integrated circuit. Each scan channel 130a, 130b, 130c drives an internal logic circuit (not shown in FIG. 1) of the integrated circuit to provide input test data for the internal logic circuits of the integrated circuit. As described in more detail hereinbelow, scan channels 130a, 130b, 130c, boundary scan receiver channel 132, and boundary scan driver channel 134 also capture LBIST input test data. The input test data captured by scan channels 130a, 130b, 130c, boundary scan receiver channel 132, and boundary scan driver channel 134 are provided to multiple-input signature register 140, which compares the actual response of the integrated circuit to the LBIST to the signature of a properly functioning integrated circuit.

Figure 7:
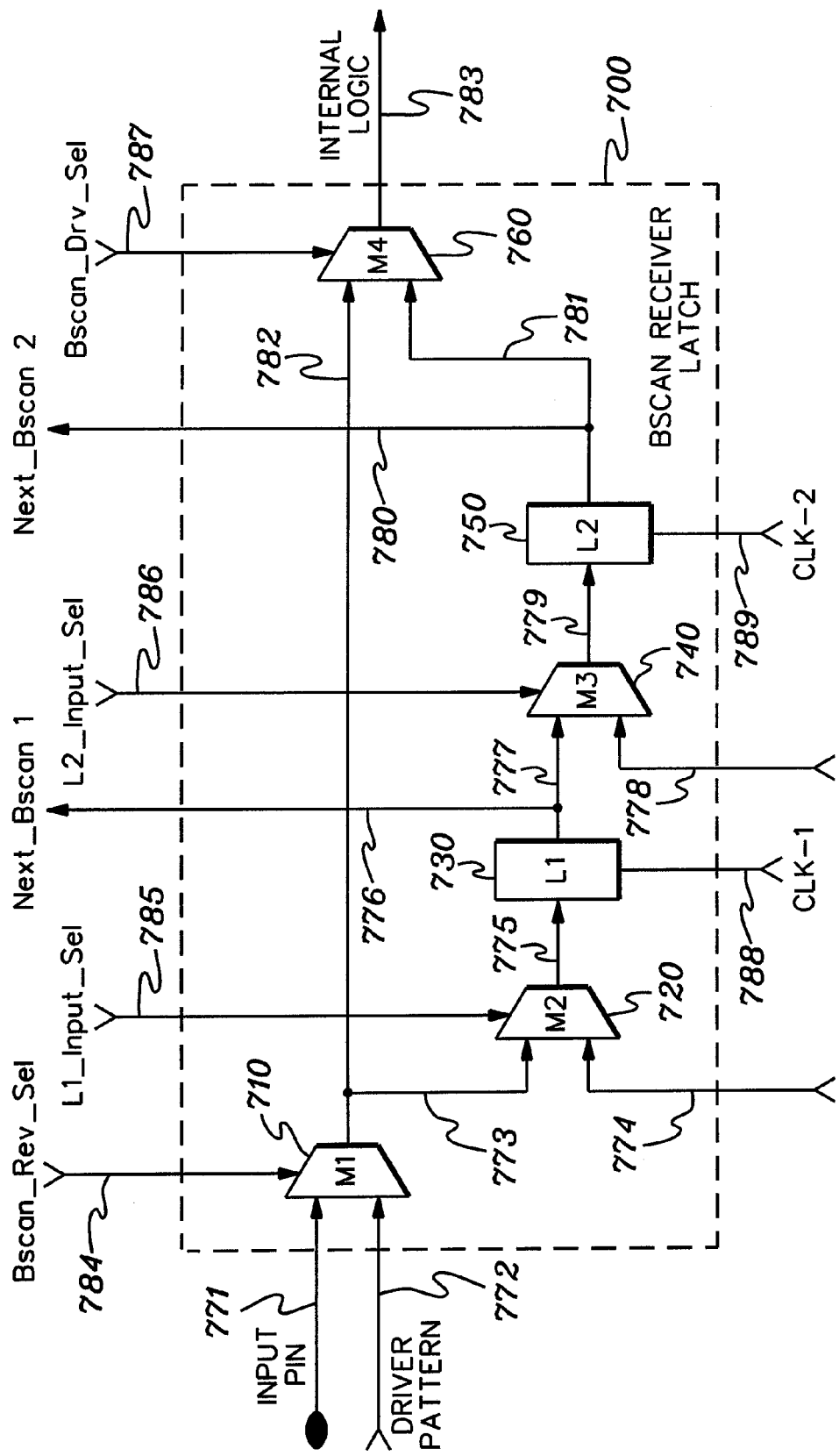
FIG. 7 illustrates one embodiment of a boundary receiver latch module of a boundary scan receiver channel of FIG. 1, in accordance with an aspect of the present invention.
Figure 9:
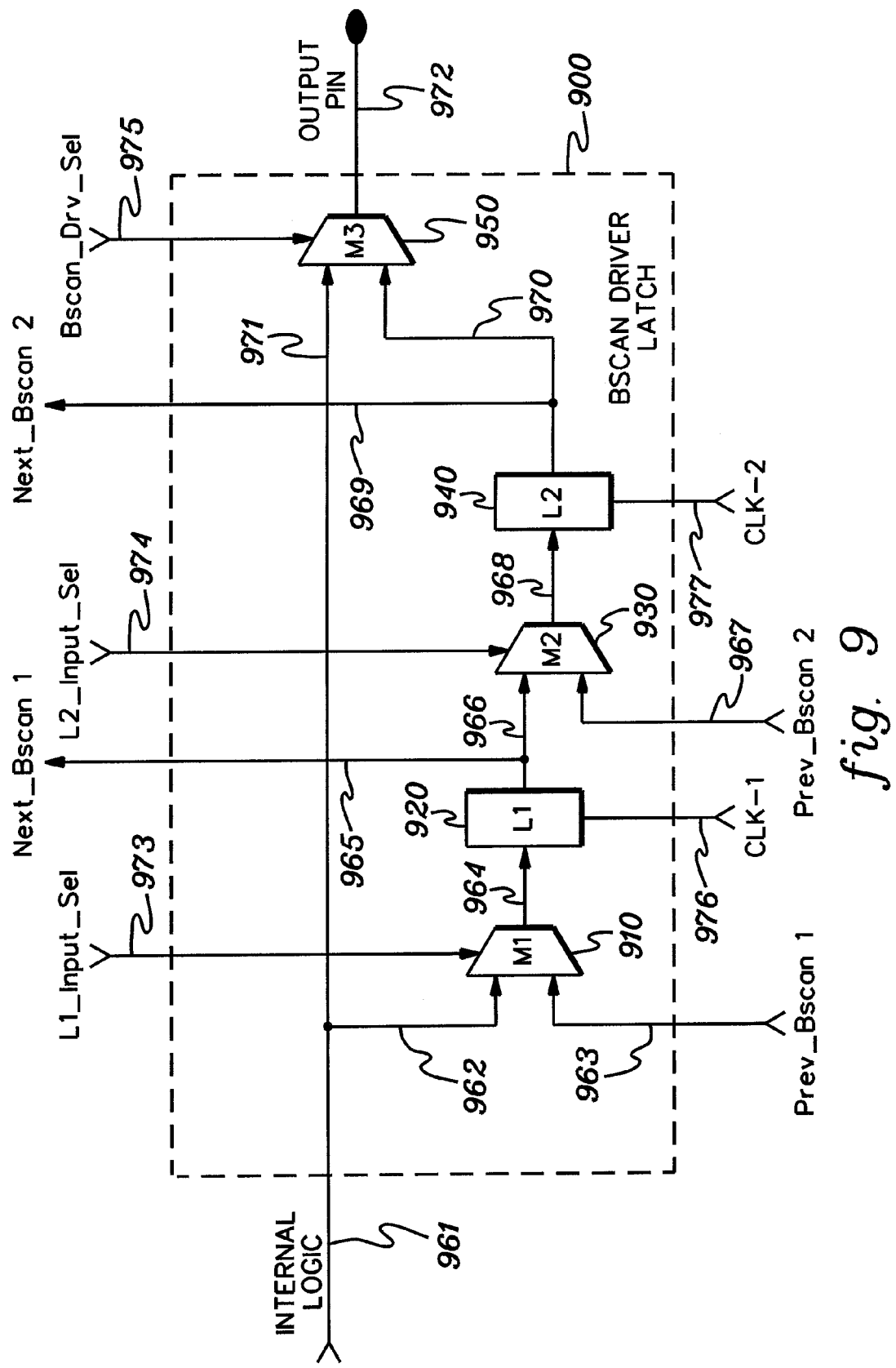
FIG. 9 illustrates one embodiment of a boundary driver latch module of a boundary scan receiver channel of FIG. 1, in accordance with an aspect of the present invention.
Figure 10:
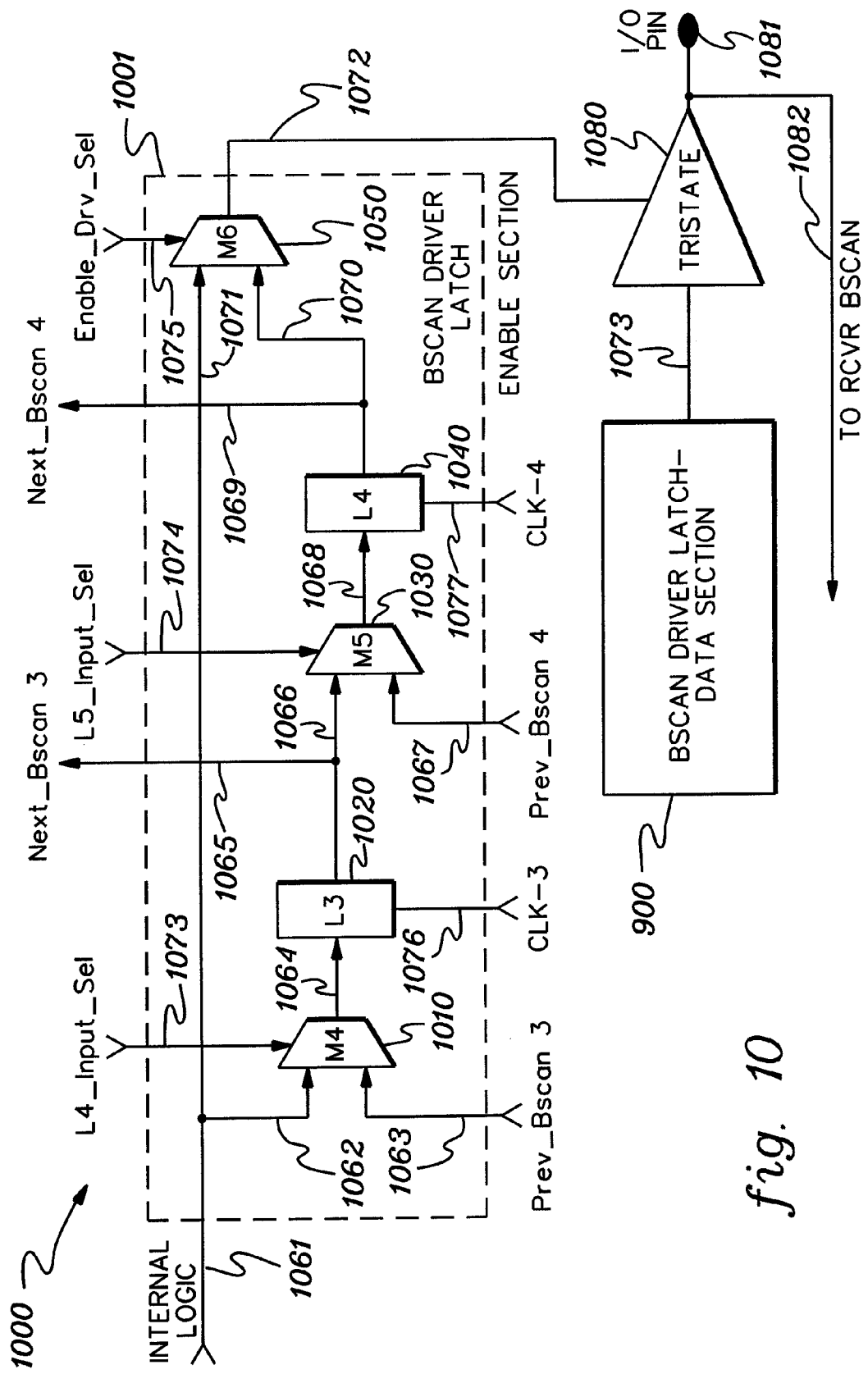
FIG. 10 illustrates one embodiment of a boundary driver latch module for a bidirectional bus, in accordance with an aspect of the present invention.

Boundary scan receiver channel 132 of FIG. 1 comprises a receiver boundary latch in accordance with an aspect of the present invention, and boundary scan driver channel 134 comprises a driver boundary latch in accordance with an aspect of the present invention. One embodiment of a receiver boundary latch of boundary scan receiver channel 132 is illustrated in FIG. 7. FIGS. 9 and 10 illustrate exemplary embodiments of a driver boundary latch of boundary scan driver channel 134. Random patterns are input to the receiver boundary latches to apply random stimuli to internal logic circuits of the integrated circuit, whereas a deterministic pattern is used to prime the driver boundary latches to assure that the integrated circuit has a predictable signature whether the integrated circuit's I/O circuits are inhibited or not. This configuration assures that the states of the boundary I/O circuits which influence internal logic circuits' states are also compressed into the LBIST signature. Consequently, an LBIST signature is produced which reflects the condition of the I/O connections as well as the internal chip logic when I/O circuits are uninhibited. Therefore, a misconnected or stuck-fault I/O circuit will cause a signature mismatch in the same fashion as an internal logic fault.

The embodiment of a logic built-in self test to test input/output circuits of an integrated circuit illustrated in FIG. 1 may include more than one boundary scan receiver channel and more than one boundary scan driver channel providing inputs to the MISR.

Figure 2:
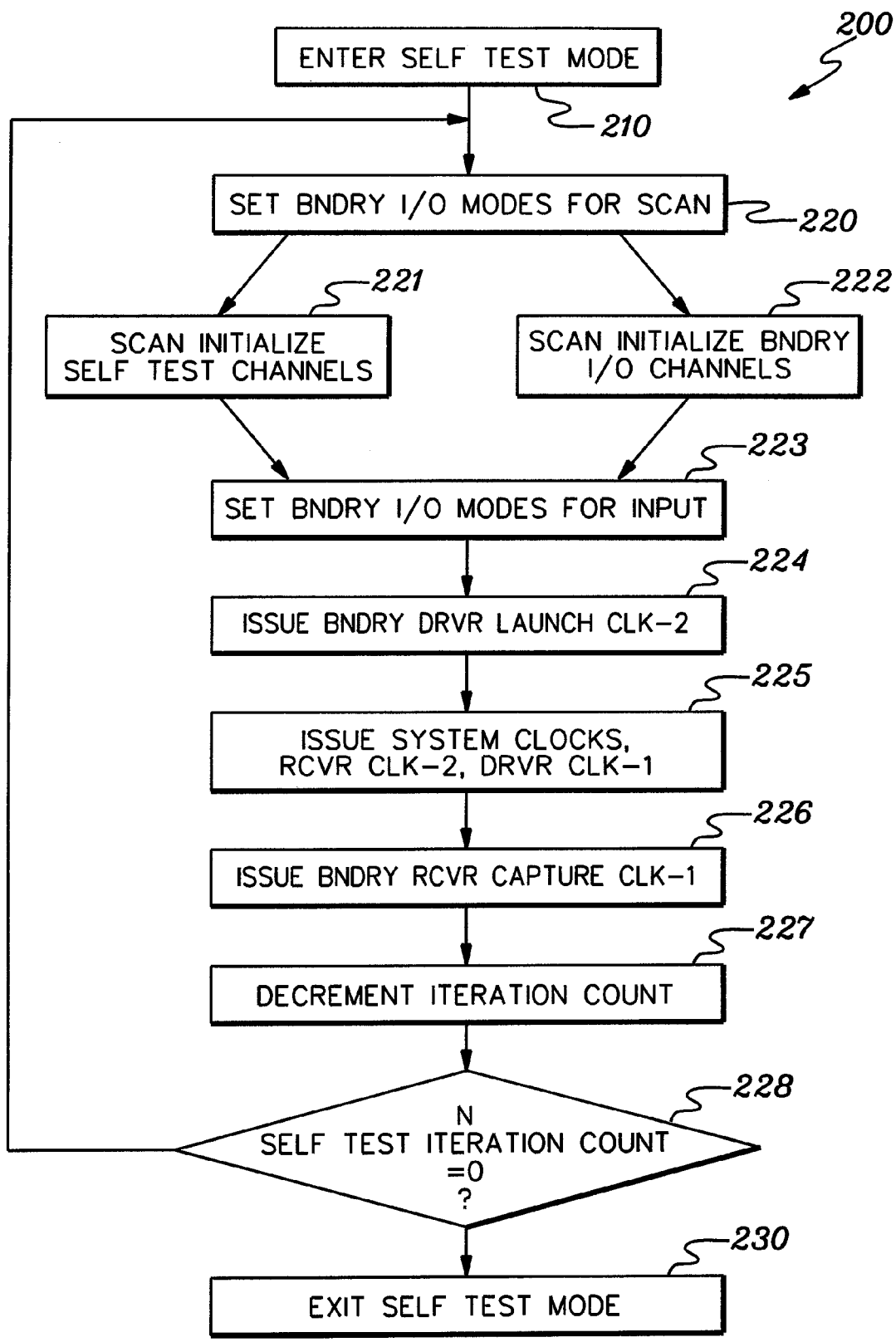
FIG. 2 illustrates a flow diagram of one embodiment of a logic built-in self-test with integrated testing of input/output circuits, in accordance with an aspect of the present invention.

The integration of I/O circuit verification with logic built-in self-test of internal logic circuits requires additional functionality in the LBIST iteration sequence. FIG. 2 illustrates a flow diagram 200 of one embodiment of a logic built-in self-test with integrated testing of input/output circuits, in accordance with an aspect of the present invention. The process begins with the integrated circuit entering a self-test mode 210. Then, the boundary latches are set up to accept input from the scan paths of the logic built-in self-test for initialization purposes 220. The processing proceeds with concurrently initializing the scan channels of internal logic circuits to be tested 221 and boundary scan channels of the I/O circuits to be tested 222. The boundary scan channels initialized in step 222 of FIG. 2 are the boundary scan receiver channels 132 and boundary scan driver channels 134 of FIG. 1.

Continuing with the flow diagram 200 of FIG. 2, the boundary scan channels are set up to accept input test data 223. For a boundary scan driver channel 134 (in FIG. 1), the input test data is provided by boundary test pattern generator 120 (FIG. 1). However, the input test data for a boundary scan receiver channel 132 (in FIG. 1) is selected from either data on an input pin of the integrated circuit or data from internal test-pattern logic of the integrated circuit. During the system clock phase of the LBIST, the internal logic of the integrated circuit is tested via the issuance of launch and capture clocks at the designed operational speed of the chip. The LBIST circuit issues a launch clock (Clk-2) 224, which is input to boundary scan driver channels, to initiate a low-clock-speed test of the I/O circuits. (Such a low-clock-speed test of the I/O circuits is also referred to as a DC I/O test herein.) Boundary scan driver channels launch data stored in the boundary scan driver channels to output pins of the integrated circuit. Then system clocks (launch and capture), boundary scan receiver launch clocks, and boundary scan driver capture clocks, e.g., the clock signals generated by on-product clock generators 160a through 160n in FIG. 1, are issued 225. The boundary scan receiver channels launch random data stored in boundary scan receiver channels via Clk-2, which is synchronously driven at machine speed with system launch clocks. The boundary scan driver channels capture internal logic test results stored in boundary driver channels via Clk-1, which is synchronously driven at machine speed with system capture clocks.

An iteration of the DC I/O test is completed with the issuance of an I/O receiver capture clock (CLK-1) 226. In response to a capture clock pulse, the boundary scan receiver channels store data from either an external input to the integrated circuit or internal test-pattern logic, i.e. boundary test pattern generator 120 in FIG. 1 via internal input 136. The control processing for the logic built-in self-test continues with decrementing an LBIST iteration count 227, which indicates the number of remaining LBIST iterations, and testing the current LBIST iteration count 228 to determine if further iterations are required. If the LBIST iteration count is not equal to zero, another LBIST iteration is initiated by continuing the processing at the beginning of the LBIST control loop, that is, setting up the boundary latches to accept input from the scan path of the logic built-in self-test 220. Alternatively, if the LBIST iteration count is equal to zero, the LBIST mode is exited 230.

The present invention utilizes a methodology which assures that a chip's LBIST signature with the chip's I/O circuits uninhibited can be predicted without knowledge of the configuration of the electronic package environment that will eventually accommodate the chip. The boundary latch drive pattern is selected such that the same LBIST signature is achieved when running standalone chip LBIST (I/O circuits inhibited) or LBIST with I/O circuit verification (I/O circuits uninhibited). With the signature made independent of the electronic package environment of the integrated circuit, various aggregations of hardware with associated input/output connections can participate in a logic built-in self-test with integrated I/O circuit testing. To obtain an LBIST signature for an integrated circuit that is independent of the electronic package environment, a deterministic data pattern is injected into the boundary driver latches during the scan phase of the LBIST. One example of a universal deterministic driver data pattern for any boundary scan chain, which is independent of inter-chip connections, is an alternating pattern of all zeros or all ones per LBIST cycle.

Figure 3:
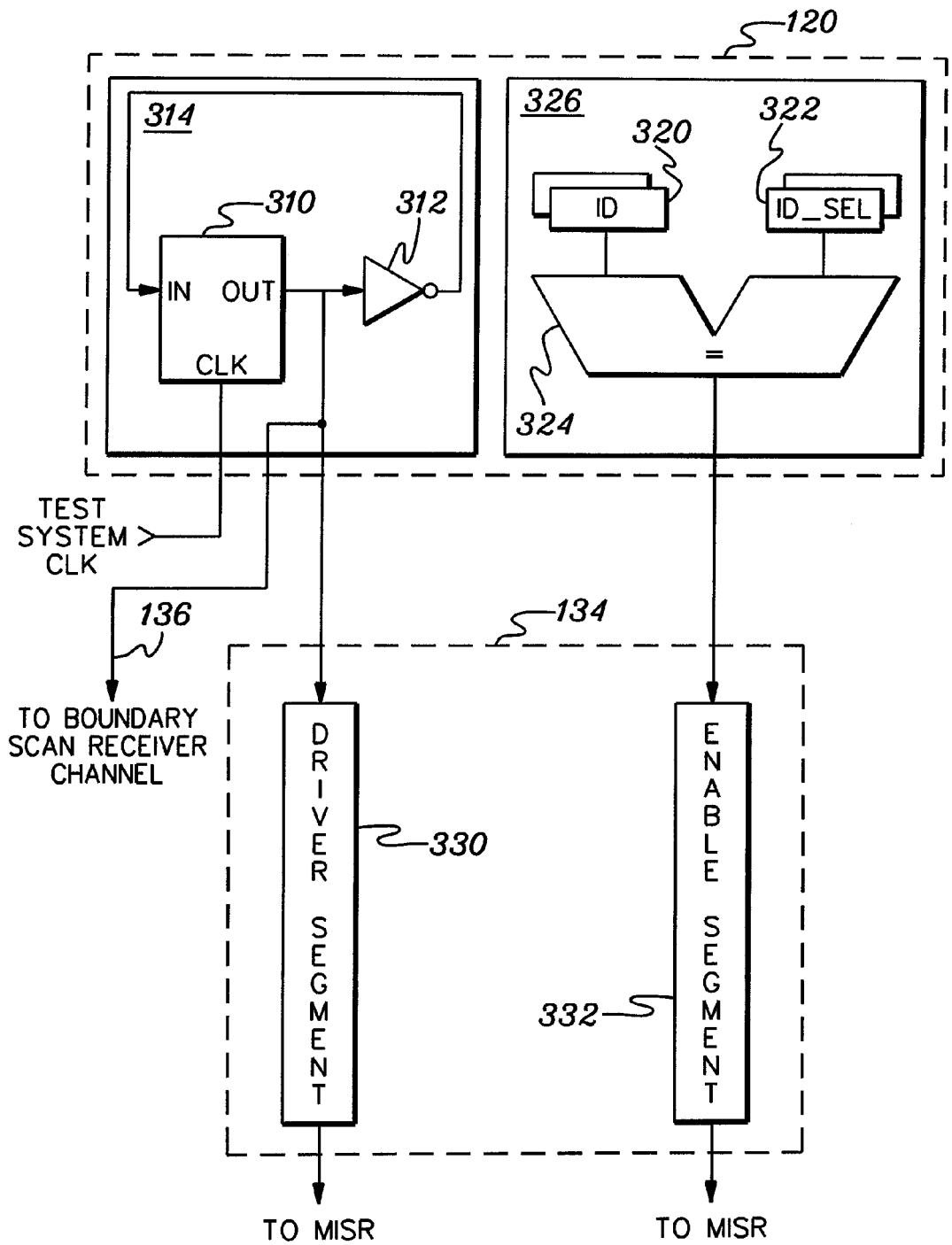
FIG. 3 illustrates one embodiment of deterministic boundary test-pattern generator logic of FIG. 1 together with one embodiment of a boundary scan driver channel of FIG. 1, in accordance with an aspect of the present invention.

FIG. 3 illustrates one embodiment of deterministic boundary test pattern generator 120 together with one embodiment of a boundary scan driver channel 134, in accordance with an aspect of the present invention. This embodiment of boundary test pattern generator 120 comprises an alternating pattern generator 314 and an enable signal generator 326. Alternating pattern generator 314 comprises latch 310 and logic inverter 312. The output of latch 310 is coupled to an input of logic inverter 312, and the output of logic inverter 312 is fed back to a data input of latch 310. The output of alternating pattern generator 314 changes to the logical inverse of the previous output of latch 310 when latch 310 is clocked by a test system clock signal, resulting in an alternating pattern of output data values. This alternating pattern of output data values from alternating pattern generator 314 is input to driver segment 330 of boundary scan driver channel 134, which will be described further hereinbelow. The boundary test pattern generator may also provide input data for boundary scan receiver latches if the associated I/O pins are not connected or non-deterministic by nature.

Enable signal generator 326 comprises an ID register 320, an ID_SEL register 322, and a comparator 324. The ID register stores an identification number for an integrated circuit. The contents of the ID_SEL register indicate the identification number of a target integrated circuit in the electronic package environment which is currently enabled to drive a shared data bus. Comparator 324 compares the current contents of ID register 320 to the current contents of ID_SEL register 322 and produces an enable signal which is input to enable segment 332 of boundary scan driver channel 134.

If the electronic package environment under test only contains point-to-point I/O connections, then deterministic patterns are input to boundary scan driver channels to support I/O circuit testing within a logic built-in self-test of an integrated circuit. However, if the electronic package environment under test contains shared buses or bi-directional buses, there is an additional requirement to support I/O circuit testing within a logic built-in self-test of an integrated circuit. It is necessary to assure that only one chip which is coupled to a shared bus or bi-directional bus drives the shared or bi-directional bus at a time. This aspect of the technique for testing I/O circuits with an LBIST is referred to as orthogonal I/O drive capability. Enable signal generator 326 of boundary test pattern generator 120 and enable segment 332 of boundary scan driver channel 134 comprise one embodiment of logic which provides orthogonal drive capability.

Figure 4:
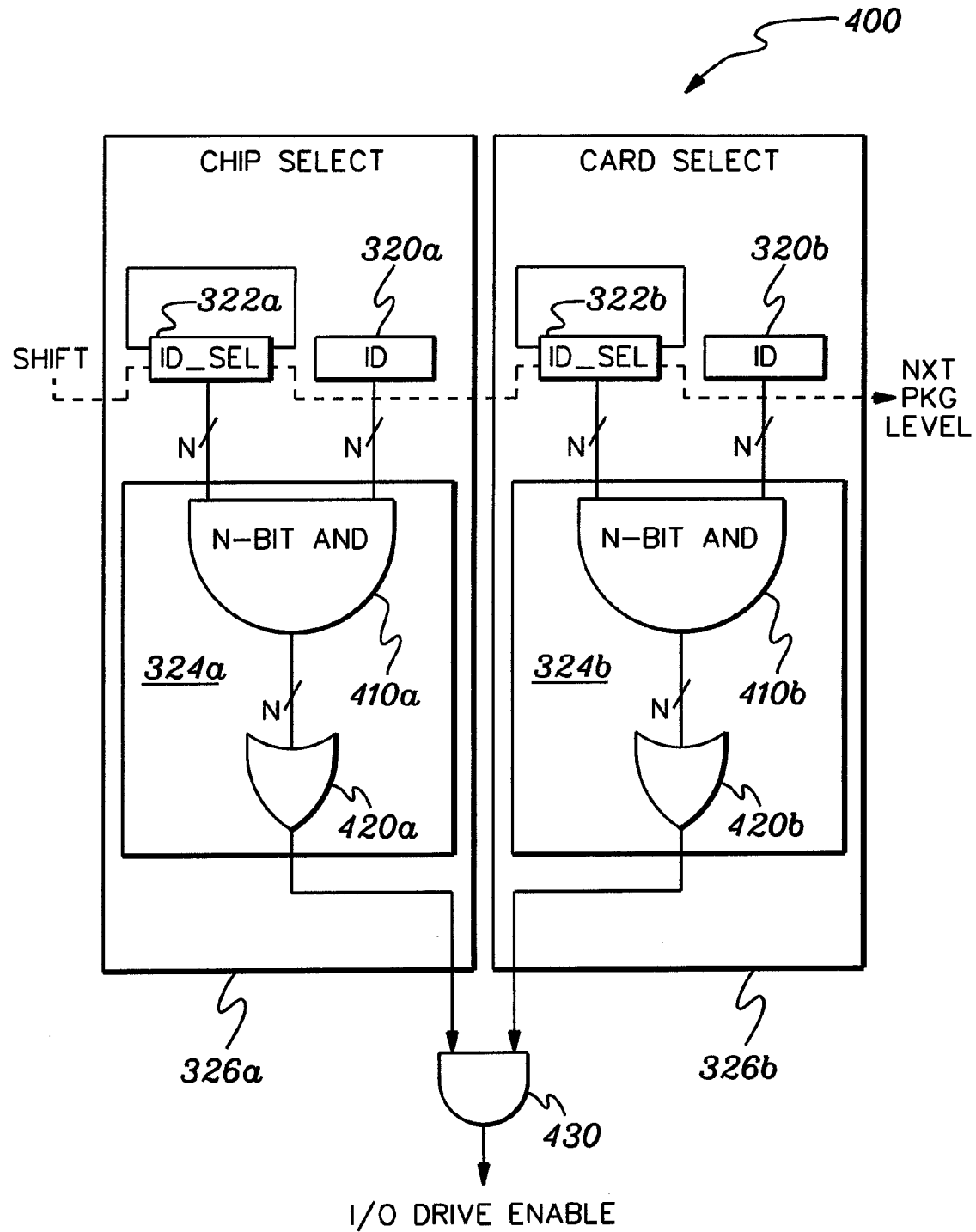
FIG. 4 illustrates one embodiment of driver-boundary-latch enable-signal logic for an electronic package environment having multiple package levels, in accordance with an aspect of the present invention.

FIG. 4 illustrates one embodiment of driver-boundary-latch enable-signal logic 400 for an electronic package environment having multiple package levels, in accordance with an aspect of the present invention. The embodiment shown in FIG. 4 illustrates the combining of a chip enable signal produced by enable signal generator 326a and a card enable signal produced by enable signal generator 326b in AND-gate 430 to produce a drive enable signal which is input to enable segment 332 of boundary scan driver channel 134 in FIG. 3.

In order to provide orthogonal I/O drive capability for an electronic package environment with shared or bi-directional buses, an ID register is also provided for each package level beyond the chip level. These ID registers reside in each chip, and the ID register for each package level must have a common size in all chips which participate in logic built-in self-testing within the multiple-level electronic package environment. The size of an ID register for a package level is chosen to be commensurate with physical package requirements (e.g. the maximum number of chips on a card) plus an allowance for possible expansion.

It is advantageous for the ID register for the lowest package level to have an odd number of bits. This assures that the LBIST iterations do not synchronize with the modulus (2) of the alternating pattern of output data values from the alternating pattern generator, which drives the driver segment of a boundary scan driver channel. Consequently, the driver segment of each boundary scan driver channel alternately receives data values of 0 and 1 for consecutive LBIST iterations. The ID register for each package level is defined to have one bit allocated for each entity to be tested in that package level. For a card package level, each bit in the corresponding ID register would represent a chip. For a board packaging level, each bit in the corresponding ID register would represent a card. The ID register hierarchy can be designed to apply to higher package levels as well (e.g., a frame). The number of package-level ID registers required is determined by how much of a system's hardware is designed to participate in concurrent logic built-in self-testing and I/O circuit testing. Although each register must be designed to accommodate the maximum conceivable number of test entities, the number of bits required typically decreases for package levels which are higher in the electronic package environment hierarchy. That is, the number of chips is typically greater than the number of cards, which is typically greater than the number of boards, for example.

The contents of the ID_SEL register indicate the identification number of a target integrated circuit which is currently enabled to drive a shared data bus in the electronic package environment. A dynamic, drive-selection register, i.e., an ID_SEL register, exists for each defined ID register, and a dynamic, drive-selection register is the same size as the corresponding ID register. The dynamic, drive-selection registers for each package level are initialized with the same value; this initial value has only one bit on. The dynamic, drive-selection registers are ring shifted during each LBIST iteration. This initialization and updating of the states of the dynamic, drive-selection registers results in drive orthogonality across the set of hardware under test by assuring that only the chip having the set of ID-register contents which matches the set of dynamic, drive-selection registers is allowed to drive a shared bus.

Although an integrated circuit may be prevented from driving a shared bus for several LBIST iterations before the chip is allowed to drive the shared bus again, the chip will be enabled for many drive cycles during I/O circuit testing with an LBIST because, typically, millions of LBIST iterations are required for coverage of a chip's internal logic. Also, it is possible to allow more than one chip to drive signal paths in the electronic package environment concurrently if none of the output circuits of the enabled chips are coupled to the same signal path. Concurrent driving of signal paths in the electronic package environment is effectuated by setting one or more of the same bit positions in the same package-level ID registers in more than one chip to the enabled value. A concurrent drive configuration pattern for the ID registers can be determined prior to testing integrated circuits of the electronic package environment based on knowledge of communication paths of the electronic package environment (as illustrated later in the discussion of FIG. 6).

Referring again to FIG. 4, the illustrated embodiment of driver-boundary-latch enable-signal logic 400 comprises an enable signal generator for each level of the electronic package environment included in the logic built-in self-test. As shown in FIG. 4, the enable signal generator for each level of the electronic package environment has essentially the same structure. Chip-select enable signal generator 326a comprises chip ID register 320a, chip ID_SEL register 322a, and a comparator 324a. Comparator 324a comprises AND-gate logic 410a, which comprises N two-bit AND gates and produces N corresponding AND-gate outputs. The corresponding bits of chip ID register 320a and chip ID_SEL register 322a are the input pairs to the N two-bit AND gates of AND-gate logic 410a. The N outputs of AND-gate logic 410a are provided as the N inputs to an N-input OR gate 420a, which produces a chip-select enable signal.

Analogously, card-select enable signal generator 326b comprises card ID register 320b, card ID_SEL register 322b, and a comparator 324b; comparator 324b comprises AND-gate logic 410b; and the N outputs of AND-gate logic 410b are provided as the N inputs to N-input OR gate 420b, which produces a card-select enable signal. For the example of FIG. 4 in which the electronic package environment includes a chip level and a card level, the chip-select enable signal produced by chip-select enable signal generator 326a and the card-select enable signal produced by card-select enable signal generator 326b combined in AND gate 430 to produce a drive enable signal for enable segment 332 of boundary scan driver channel 134 in FIG. 3.

As illustrated in FIG. 4, the dynamic, drive-selection registers, chip ID_SEL register 322a and card ID_SEL register 322b, are ring shifted so that the enable value, e.g. a bit value equal to 1, moves from one bit position of these ID_SEL registers to another adjacent bit position when a shift is signaled. In addition, chip ID_SEL register 322a and card ID_SEL register 322b are connected in a manner such that when a bit value equal to 1 is shifted out of the least significant bit (LSB) of an ID_SEL register, a ring shift of the ID_SEL register corresponding to the next level of the electronic package environment is induced. For example, when the content of the LSB of chip ID_SEL register 322a is equal to 1, a ring shift of card ID_SEL register 322a also causes a ring shift of card ID_SEL register 322b in FIG. 4. A driver segment 330 of boundary scan driver channel 134 in FIG. 3 is not enabled unless each of bits in the chip's ID registers corresponding to a bit in the ID_SEL registers having a value of 1 also currently stores the value 1. One embodiment of logic for generating an enable signal in accordance with this control rule from the contents of the ID registers and ID_SEL registers comprises comparator 324a, comparator 324b, and AND-gate 430 as illustrated in FIG. 4.

U.S. patent application Ser. No. 10/753,852, filed Jan. 8, 2004, and published Jul. 14, 2005 as U.S. Patent Publication No. US 2005/0155003 A1, by Rich et al., entitled "Scalable Logic Self-Test Configuration for Multiple Chips", which is hereby incorporated herein by reference in its entirety, discloses a method of synchronously self-testing hardware configurations spanning multiple chips and multiple levels of an electronic package environment. This method can advantageously utilize integrated logic built-in self-testing and testing of the input/output circuits of an integrated circuit in accordance with the present invention to verify an external signal path between chips of an electronic package environment.

The present invention gives electronic hardware the capability to simultaneously perform input/output connection checks and logic built-in self-testing of the internal logic circuits of an integrated circuit. Advantageously, the integration of these tests eliminates the need to maintain input/output location and configuration data to support boundary scan I/O testing. Also, the test overhead associated with conducting separate boundary scans during hardware power-on sequences is eliminated. Consequently, the time required to verify hardware at power-on or reset is reduced. Moreover, if a failure is detected during the testing of an integrated circuit in an electronic package environment, the techniques of the present invention also support traditional boundary scan testing to further isolate the failure.

This invention also provides a method of testing the I/O circuits of different integrated circuits which are connected to bi-directional or shared buses by arbitrating among the I/O circuits to prevent more than one I/O circuit, which are connected to a bi-directional or shared bus, from simultaneously driving the bi-directional or shared bus during testing. The use of chip-resident ID registers and a dynamic, drive-selection registers provides distributed control to facilitate testing multiple chips in multiple hardware package configurations without the need for maintaining chip configuration data. Furthermore, the present invention provides the capability to integrate I/O connection checks with logic built-in self-testing across multiple hardware package levels, e.g. from a chip on a card of a board to another chip on another card of another board.

The present invention provides a simple-to-implement protocol that synchronizes multiple-chip LBIST executions, independent of the electronic package configuration. This testing protocol assures that a repeatable and consistent signature is produced for each participating chip which executes an LBIST, whether integrated I/O checking is enabled or disabled. This allows the mechanism of the present invention to be utilized in multiple-pass testing to diagnose I/O circuit problems. For example, the chips can proceed through logic built-in self-testing with I/O checking disabled (traditional LBIST). Then, the chips can be tested with I/O checking enabled. By examining the LBIST signatures of two chips with and without I/O checking enabled, one can determine whether the location of the failure is a chip's I/O circuit, another circuit of a chip, or an I/O signal path based on which signature is bad.

Figure 5:
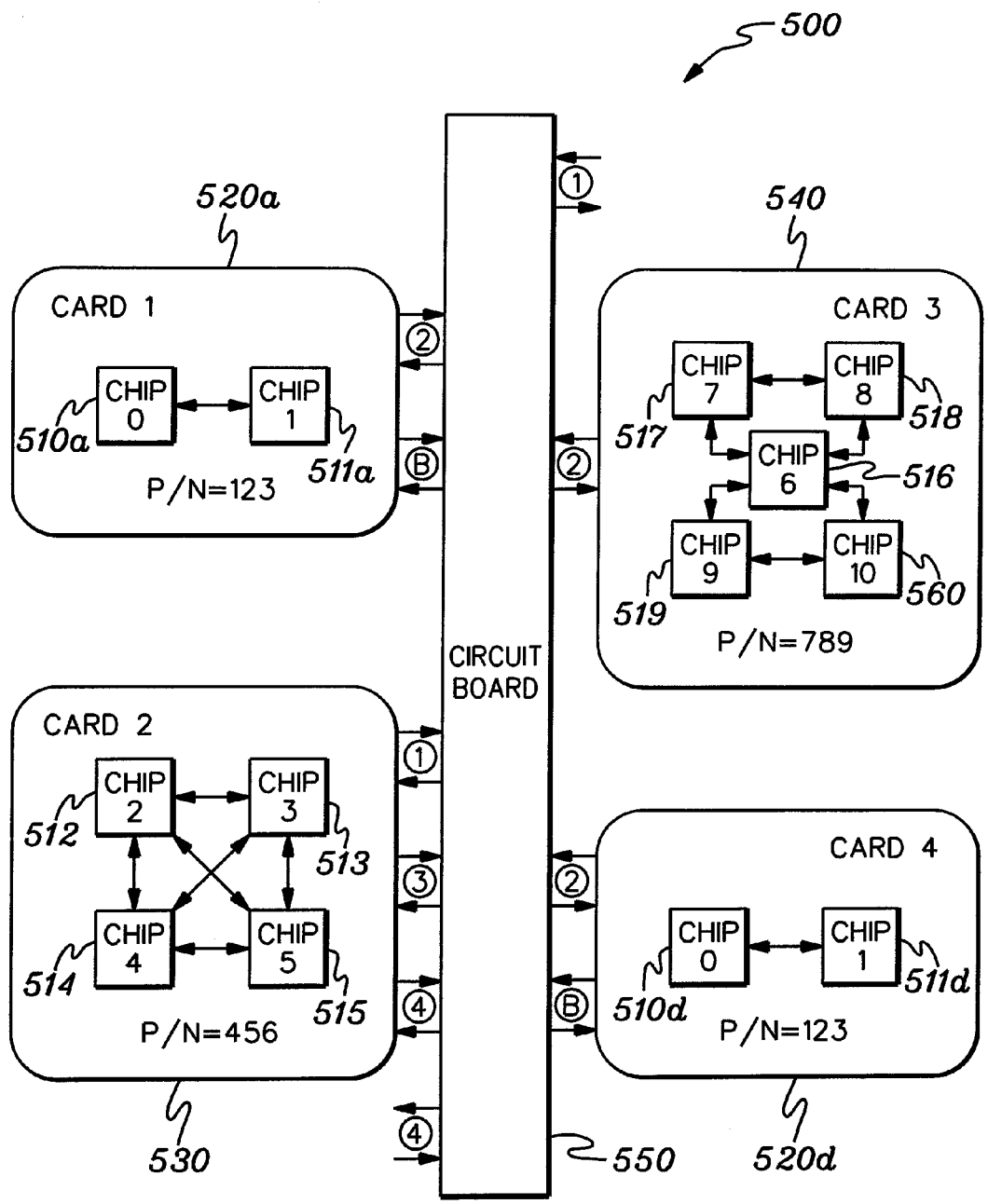
FIG. 5 illustrates an example of an electronic package environment in which integrated circuits perform logic built-in self-tests with integrated input/output testing, in accordance with an aspect of the present invention.

FIG. 5 illustrates an example of an electronic package environment 500 in which integrated circuits perform logic built-in self-tests with integrated input/output circuit testing, in accordance with an aspect of the present invention. Electronic package environment 500 comprises two instances of Chip 0 (chips 510a and 510d), two instances of Chip 1 (chips 511a and 511d), chips 512 through 519, chip 560, four circuit cards (cards 520a, 530, 540, and 520d), and circuit board 550. Cards 520a and 520d are of the same type, as indicated by their identical part numbers in FIG. 5.

Card 520a comprises chip 510a and chip 511a, and chips 510a and 511a communicate with each other, as illustrated in FIG. 5. Similarly, card 520d comprises chips 510d and 511d, which communicate with each other. Card 530 comprises chips 512, 513, 514, and 515, which are interconnected as shown in FIG. 5. Card 540 comprises chips 516, 517, 518, 519, and 560, which are interconnected as shown in FIG. 5. Cards 520a, 530, 540, and 520d each communicate with circuit board 550. In the example of FIG. 5, the hierarchy of the illustrated packaging levels from lowest level to highest level is as follows: chip level, card level, and board level.

The signal paths in the hardware configuration of electronic package environment 500 of FIG. 5 include both bi-directional buses as well as point-to-point I/O paths between I/O circuits. Therefore, logic built-in self-testing of this electronic package environment requires that the chips be enabled to drive the signal paths orthogonally. To facilitate the discussion of one embodiment of the control and coordination of the testing of the chips' output circuits in accordance with the present invention, the I/O signal-path groups to and from each circuit card of FIG. 5 are labeled with a circled number or the circled letter "B". The circled number denotes the numeric part of the card name that a particular card communicates with; that is, it indicates that the chips of a given card communicate with the chips located on the designated card. The circled letter "B" denotes that the chips of a card communicate with the circuit board I/O. For example, Card 1 520a has two I/O groups, which communicate with Card 2 530 and the circuit board I/O, respectively.

As discussed above, the registers used in generating the drive enable signal are sized commensurate with the number of components in the electronic package environment. The number of register bits for each level of the electronic package environment must be greater than or equal to the number of components at each level, and it is advantageous to for the number of register bits to be an odd number for the first level of the electronic package environment's hierarchy. In FIG. 5, the greatest number of chips on a circuit card is five, and there are four circuit cards and only one circuit board. Therefore, the chip ID register and the chip selection register (chip SEL_ID register) must have at least five bits if design-specific optimizations are not considered. The card-level registers must have at least four bits.

FIG. 6 illustrates the identification register settings for two exemplary test configurations of integrated circuits in the electronic package environment of FIG. 5, in accordance with an aspect of the present invention. In these examples, a common identification register length of five bits has been used for both package levels. The left side of FIG. 6 illustrates one example of ID register settings which only enable one chip's boundary driver latches at a time for logic built-in self-testing of the integrated circuits in electronic package environment 500 of FIG. 5. The right side of FIG. 6 shows one example of optimized ID register settings that take into account inherently orthogonal chips that can be enabled to drive their outputs at the same time. Orthogonal (non-optimized) ID register settings are advantageous if the ID registers' contents are hardwired and other, unknown hardware, which participates in logic built-in self-testing, may be added later.

If the capability to load the ID registers at hardware initialization time is provided, then one can take advantage of optimizations which increase the amount of time certain chips will be enabled to drive their outputs. Such optimizations allow inherently orthogonal chips to simultaneously drive their outputs. Examples of inherently orthogonal chips are chips which do not communicate with one another, or the chips located on higher package-level components (e.g., cards) which do not communicate with one another. For example, in FIG. 5, Card 1 (520a) and Card 4 (520d) do not communicate with each other or with Card 3 (540). On Card 3 (540), Chip 7 (517) and Chip 8 (518) do not communicate with Chip 9 (519) and Chip 10 (560). Also, there is an unused bit in the board ID register because the board ID register has five bits, but there are only four cards in the electronic package environment 500 of FIG. 5.

The right side of FIG. 6 illustrates optimizations that allow more than one chip to drive their outputs concurrently. The chips of cards 520a and 520d are given the same bit designation in their board ID registers so that chips on these cards can be simultaneously drive enabled. On Card 3 (540), chips 517 (Chip 7) and 518 (Chip 8) are given the same chip ID register bit assignments as chips 519 (Chip 9) and 560 (Chip 10), respectively. Therefore, chips 517 and 519 (i.e., Chip 7 and Chip 9) of card 540 (Card 3) will be enabled concurrently. Similarly, chips 518 and 560 (i.e., Chip 8 and Chip 10) of card 540 (Card 3) will be enabled concurrently during time intervals when chips 517 and 519 are not enabled. By assigning the value 1 to more than one bit in the identification registers of the chips in an electronic package environment, it is possible to repeat valid orthogonal drive-enable configurations to increase the output drive activity of the chips for each cycle of the LBIST.

This illustrated by the contents of the ID registers of the chips comprising card 540 (Card 3). Since there are only four circuit cards in the electronic package environment of FIG. 5, the fifth bit of the board ID register is used to enable the chips of card 540 (Card 3) a second time during the logic built-in self-test cycle by assigning the value 1 to the fifth bit of the board ID registers of all chips on card 540 (Card 3). Also, because the number of bits in the card ID registers exceeds the number of chips on cards 520a and 520d (Card 1 and Card 4, respectively, in FIG. 6), the card ID registers of chips 510a and 511a (Chip 0 and Chip 1 of Card 1 in FIG. 6) and chips 510d and 511d (Chip 0 and Chip 1 of Card 4 in FIG. 6) have more than one bit set equal to 1. In addition, chips 517, 518, 519, and 560 are enabled twice, as indicated by the two 1's in their card ID registers illustrated in FIG. 6 under Card 3 and labeled Chip 7 card ID reg, Chip 8 card ID reg, Chip 9 card ID reg, and Chip 10 card ID reg, respectively, each time the chips of card 540 are eligible to be enabled, which is indicated where a bit value equal to 1 is placed in the chips' board ID registers.

In the example of FIG. 5, there are external inputs to the circuit board of hardware configuration under test which are not driven according the boundary I/O requirements for a consistent signature. This are included in board I/O groups 1 and 4, shown at top and bottom of FIG. 5, respectively. Consequently, the receiver boundary latches associated with board I/O of the chips on Card 1 (520a) and Card 4 (520d) must be configured to utilize their internal driver patterns when entering self-test mode. The reason is that the chips of Card 1 (520a) and Card 4 (520d) in FIG. 5 will receive these signals from the circuit board I/O group B, which has an indeterminate input in this test environment. One embodiment of a receiver boundary latch, which facilitates this selection of input signals for integrated LBIST and boundary I/O testing, is disclosed below.

The boundary latch embodiments disclosed herein facilitate the integration of I/O and LBIST testing. In accordance with an aspect of the present invention, a unique test mode is provided by receiver boundary latch embodiment which allows external inputs to the device under test, i.e., an integrated circuit, to influence the state of the integrated circuit's internal logic so that the final state of the chip's LBIST signature is a function of both the chip's internal logic and the data values input to the internal logic from the chip's external input pins during each cycle of an LBIST of the integrated circuit. In accordance with an aspect of the present invention, these boundary latch embodiments provide separate launch and capture latches, having associated launch and capture clock controls, in order to provide controlled test sequences for testing the I/O pins of the integrated circuit in LBIST mode. In these embodiments, all fundamental latches of a boundary latch have a separate scan path, such that each fundamental latch can be aggregated into an independent scan channel to be fed into a multiple-input signature register (MISR) as shown in FIG. 1. This allows I/O test results to directly influence an LBIST signature.

A receiver boundary latch embodiment in accordance with the present invention provides a solution to the problem of the variability of the nature of the inputs provided to chip input pins by respect to external interfaces. In particular, some inputs to the integrated circuit may be non-deterministic due to the configuration or function of an electronic package environment. The receiver boundary latch embodiment of the present invention has the capability to select and utilize either external stimuli or internally generated stimuli during logic built-in self-test as indicated by control signals. This mechanism allows chip I/O, for a particular I/O group, to receive test stimuli concurrently from a source internal to the chip in order to maintain a predictable signature value during concurrent testing of these chips.

Advantageously, these features are provided in a boundary latch embodiment which also supports use of the boundary latch to perform traditional LBIST or IEEE Standard 1149.1 Boundary Scan tests by properly configuring them for such testing.

FIG. 7 illustrates one embodiment of a boundary receiver latch module 700, in accordance with an aspect of the present invention. Boundary receiver latch module 700 comprises multiplexers 710, 720, 740, and 760 and latches 730 and 750. The convention for all multiplexers illustrated in FIG. 7 is that a multiplexer selects the top input when the selection input of the multiplexer is a logic value equal to 0, and the multiplexer selects the bottom input when the selection input of the multiplexer is a logic value equal to 1. The following describes the operation of boundary receiver latch module 700.

During normal operation of an integrated circuit, i.e., non-test mode, selection control inputs 784 and 787, Bscan_Rcv_Sel and Bscan_Drv_Sel, respectively, of multiplexers 710 and 760, respectively, are both set equal to 0 to enable a signal path comprising signal path segments 771, 782, and 783 from an input pin to internal logic. In LBIST mode, latches 730 and 750 must be initialized for each iteration of the self-test. This is accomplished by setting L1_Input_Sel input 785 and L2_Input_Sel input 786 equal to 1. These selection control input settings enable boundary scan path Bscan 1, comprising Prev_Bscan 1 input 774, multiplexer M2 output 775, and Next_Bscan 1 output 776, and boundary scan path Bscan 2, comprising Prev_Bscan 2 input 778, multiplexer M3 output 779, and Next_Bscan 2 output 780. Instances of boundary receiver latch module 700 are appropriately connected to create one or more boundary scan receiver channels 132, which feed an LBIST MISR, as illustrated in FIG. 1.

After latch initialization, latch 730 contains random launch data to drive internal logic of the integrated circuit. When the LBIST system clocks are activated, clock signal CLK-2 789 is activated along with the chip's internal logic clocks in order to synchronously launch data from latch 730. L2_Input_Sel input 786 must be set to 0 and Bscan_Drv_Sel input 787 must be set to 1 to enable the path comprising latch L1 output 777, multiplexer M3 output 779, latch L2 output 781, and multiplexer M4 output 783 for data launch. A key feature of boundary receiver latch module 700 is the capability to capture external I/O values during LBIST. External I/O values are captured during LBIST by setting the selection control inputs to the multiplexers as follows: Bscan_Rcv_Sel 784 is set to 0; and L1_Input_Sel input 785 is set to 0. This allows an external input on an input pin to be captured by latch 730 when capture clock (CLK-1) 788 is activated via the path comprising signal path segments 771 and 773 and multiplexer M2 output 775. Alternatively, the receiver boundary latch can be driven by an internally generated test pattern 772, which is input to multiplexer 710, if Bscan_Rcv_Sel 784 is set to 1. Then, the capture path on the activation of capture clock (CLK-1) 788 is internally generated test pattern 772, signal path segment 773, and multiplexer M2 output 775. The value of the selection control input for multiplexer 710, Bscan_Rcv_Sel 784, is determined as a function of the topology of the electronic package environment and which of the resulting I/O groups are to participate in the LBIST. Boundary receiver latch module 700 can also be utilized in standard boundary scan tests by setting Bscan_Rcv_Sel 784 and L2_Input_Sel input 786 equal to 0.

Figure 8:
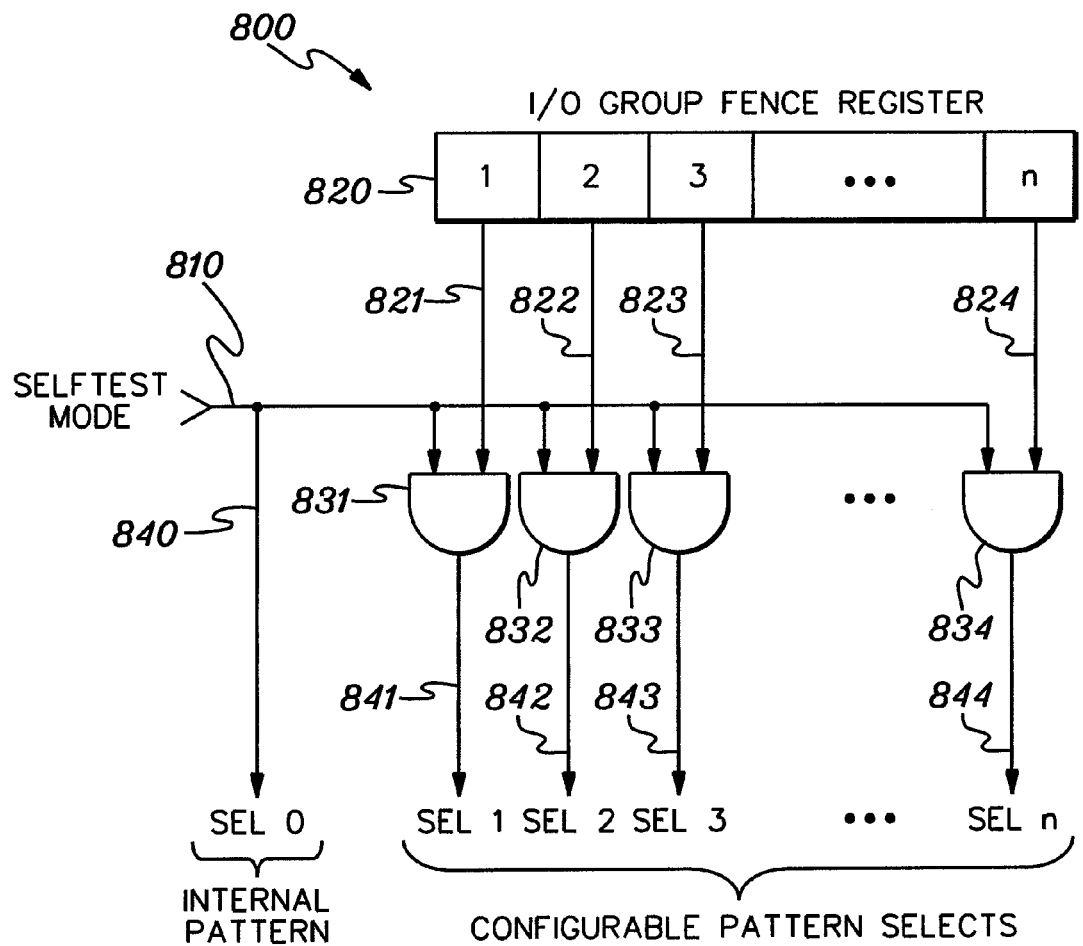
FIG. 8 illustrates one embodiment of a test input selection signal generator for the input/output groups of an electronic package environment, in accordance with an aspect of the present invention.

FIG. 8 illustrates one embodiment of a test input selection signal generator 800 for the input/output groups of an electronic package environment, in accordance with an aspect of the present invention. One of the selection signals 840, 841, 842, 843, through 844 is provided as the selection control input, Bscan_Rcv_Sel 784, to multiplexer 710 in FIG. 7. Test input selection signal generator 800 of FIG. 8 comprises I/O group fence register 820 and AND-gates 831, 832, 833, though 834. Self-test-mode signal 810 is provided as an input to test input selection signal generator 800. Self-test-mode signal 810 indicates whether the chip is currently in a self-test mode or non-test mode of operation. I/O group fence register 820 comprises n bits, one bit for each of n possible I/O groups. The bits stored in I/O group fence register 820 indicate whether corresponding receiver boundary latches are to receive test inputs from external inputs to the integrated circuit or an internal test pattern generator during LBIST. Self-test-mode signal 810 is passed along as selection signal SEL0 840. On the other hand, selection signals SEL1 841 through SELn 844 are provided by the outputs of AND-gates 831 through 834. Selection signals 841, 842, 843, and 844 are computed as the logical-AND function of self-test-mode signal 810 and fence register bits 821, 822, 823, and 824, respectively.

If a chip I/O group is to always utilize an internally generated test pattern for logic built-in self-testing, selection signal SEL0 840 is provided as the selection control input, Bscan_Rcv_Sel 784, to multiplexer 710 of each instance of the boundary receiver latch module in FIG. 7 for the chip I/O group. A chip I/O group must utilize an internally generated test pattern for LBIST in the following situation, for example: the chip I/O group may receive input from circuitry that does not control its output circuits according to the requirements for integrated testing of I/O circuits and LBIST. In this situation, the selection of input signals for the effected I/O group is not configurable in self-test mode. For configurable LBIST cases, the I/O fence register is used to select which I/O groups will receive external input and which I/O groups will receive internally generated data patterns. In other words, the bit values stored in I/O group fence register 820 either allow receiver boundary latches of an I/O group to receive external inputs during LBIST or isolate receiver boundary latches of an I/O group from the inputs of non-participating interfaces by driving the I/O group with an internally generated pattern. This LBIST configurability can be used for diagnostic purposes or to support multiple hardware configurations.

FIG. 9 illustrates one embodiment of a boundary driver latch module 900, in accordance with an aspect of the present invention. Boundary driver latch module 900 comprises three multiplexers (910, 930, and 950) and two latches (920 and 940). The convention for all multiplexers illustrated in FIG. 9 is that a multiplexer selects the top input when the selection input of the multiplexer is a logic value equal to 0, and the multiplexer selects the bottom input when the selection input of the multiplexer is a logic value equal to 1. The following describes the operation of boundary driver latch module 900.

During normal (non-test mode) operation, the Bscan_Drv selection signal 975 is set equal to 0 to enable a direct path from internal logic input 961 to output 972 via path segment 971. In LBIST mode, latch 920 and latch 940 must be initialized for each iteration of the self-test. The scan path of latch 920 (Bscan 1) is enabled by setting the selection signal L1_Input_Sel 973 equal to 1. The scan path of latch 920 comprises Prev_Bscan1 input 963, multiplexer M1 output 964, and Next_Bscan1 output 965. Similarly, the scan path of latch 940 (Bscan 2) is enabled by setting the selection signal L2_Input_Sel 974 equal to 1. The scan path of latch 920 comprises Prev_Bscan2 input 967, multiplexer M2 output 968, and Next_Bscan2 output 969. The previous and next boundary scan inputs and outputs are appropriately connected to other boundary driver latch modules to create driver boundary scan channels which can feed an LBIST MISR as illustrated in FIG. 1. After latch initialization, the latch 920 contains datum of a deterministic data pattern to drive an external I/O connection during the launch phase of boundary driver latch operation for LBIST. Clock signal CLK-2 977 is activated to synchronously launch data from latch 920. Selection signals L2_Input_Sel 974 and Bscan_Drv_Sel 975 must be set to 0 and 1, respectively, to enable the signal path for data launch, i.e., from latch L1 output 966 to multiplexer M2 output 968 to latch L2 output 970 to output 972. Datum from internal logic that drives I/O pins is captured when capture clock (CLK-1) 976 is activated along with internal logic capture clocks. Selection signal L1_Input_Sel 973 is set to 0 to enable the data capture path from internal logic input 961 to multiplexer M1 output 964 (via multiplexer M1 input 962) on capture clock (CLK-1) 976 activation. Alternatively, a traditional boundary scan test, in which there is no scan channel for latch 940, can be conducted by setting selection signal L2_Input_Sel 974 equal to 0.

FIG. 10 illustrates one embodiment of a boundary driver latch module 1000 for a bi-directional driver or bus, in accordance with an aspect of the present invention. Boundary driver latch module 1000 for a bi-directional bus comprises Bscan driver latch enable circuit 1001, boundary driver latch module 900 for data, and tri-state device 1080. Bscan driver latch enable circuit 1001 controls which direction data is flowing through I/O pin 1081, which is connected to a bi-directional driver or bus. When control input 1072 to tri-state device 1080 is set equal to 1, tri-state device 1080 enters a high impedance state that effectively disconnects boundary driver latch module 900, which drives data input 1073 of tri-state device 1080. This allows path 1082 to function as an input connection from I/O pin 1081. When I/O pin 1081 is connected to a bi-directional driver or shared bus, another chip can drive data onto the bi-directional driver or common bus when tri-state device 1080 of boundary driver latch module 1000 is in a high impedance state.

The structure of Bscan driver latch enable circuit 1001 is essentially the same as the structure of boundary driver latch module 900, which is illustrated in FIG. 9. As illustrated in FIG. 10, Bscan driver latch enable circuit 1001 comprises multiplexers 1010, 1030, and 1050 and latches 1020 and 1040.

Bscan driver latch enable circuit 1001 provides control input 1072 to tri-state device 1080. At latch initialization time of each LBIST sequence, latches 1020 and 1040 can be initialized with initialization values from their respective scan paths when selection inputs L4_Input_Sel 1073 and L5_Input Sel 1074 are set to 1. This enables the scan path (Bscan 3) of latch 1020, which comprises Prev_Bscan3 input 1063, multiplexer M4 output 1064, and Next_Bscan3 output 1065, and the scan path (Bscan4) of latch 1040, which comprises Prev_Bscan4 input 1067, multiplexer M5 output 1068, and Next_Bscan4 output 1069. The capability to initialize latches 1020 and 1040 for each LBIST iteration provides the capability to select one boundary driver latch module of multiple boundary driver latch modules in an electronic package environment to drive a bi-directional bus or shared bus for each LBIST iteration. When an integrated circuit operates in LBIST mode, the latches of boundary driver latch module 900 of boundary driver latch module 1000 for a bi-directional driver or bus must also be initialized for each LBIST iteration as described above in conjunction with FIG. 9.

By setting selection signals L2_Input_Sel 974 (FIG. 9) and L5_Input Sel 1074 (FIG. 10) equal to 0, boundary driver latch module 1000 for bi-directional and shared buses can be utilized in traditional boundary scan tests.

The boundary latch embodiments of the present invention provide the following unique features that enable electronic hardware to concurrently perform input/output connection checks and LBIST of a chip's internal logic: a capability to configure boundary driver latch operation such that external input values influence an LBIST signature; separately controlled launch and capture paths within a boundary latch; a capability to include all latches of a boundary latch in scan channels for LBIST; a capability to control which I/O groups participate in LBIST; control of data flow on bi-directional and shared buses each LBIST iteration; and configuration controls which support traditional boundary scan testing as well as new test modes.

The capabilities of one or more aspects of the present invention can be implemented in software, firmware, hardware or some combination thereof.

One or more aspects of the present invention can be included in an article of manufacture (e.g., one or more computer program products) having, for instance, computer usable media. The media has therein, for instance, computer readable program code means or logic (e.g., instructions, code, commands, etc.) to provide and facilitate the capabilities of the present invention. The article of manufacture can be included as a part of a computer system or sold separately.

Additionally, at least one program storage device readable by a machine embodying at least one program of instructions executable by the machine to perform the capabilities of the present invention can be provided.

The flow diagrams depicted herein are just examples. There may be many variations to these diagrams or the steps (or operations) described therein without departing from the spirit of the invention. For instance, the steps may be performed in a differing order, or steps may be added, deleted or modified. All of these variations are considered a part of the claimed invention.

Although preferred embodiments have been depicted and described in detail herein, it will be apparent to those skilled in the relevant art that various modifications, additions, substitutions and the like can be made without departing from the spirit of the invention and these are therefore considered to be within the scope of the invention as defined in the following claims.

What is claimed is:

1. A method of controlling test data with a boundary latch module having a plurality of latches to facilitate testing an external signal path of an integrated circuit concurrently with logic built-in self testing of the integrated circuit, the method comprising:
   (i) providing a plurality of selection devices coupled to a plurality latches of a boundary latch module, the plurality of selection devices for selecting initialization data to store in the plurality of latches of the boundary latch module of the integrated circuit;
   (ii) utilizing the plurality of selection devices to select the initialization data from a plurality of scan paths of the integrated circuit;
   (iii) providing the initialization data from at least one of the plurality of latches as at least one output of the integrated circuit for testing at least one external signal path of the integrated circuit;
   (iv) providing another selection device in the another boundary latch module, the another selection device for selecting an external datum provided by an external input to the integrated circuit or a test-pattern datum from test-pattern generator logic of the integrated circuit;
   (v) utilizing the another selection device to select the external datum or the test-pattern datum as a datum for capture in at least one of the plurality of latches of the another boundary latch module; and
   (vi) providing the datum captured by the at least one of the plurality of latches of the another boundary latch module as at least one input to a multiple-input signature register, the multiple-input signature register storing a signature of the integrated circuit resulting from the logic built-in self-testing.

2. The method of claim 1, wherein test-pattern generator logic of the integrated circuit provides the initialization data to the plurality of scan paths.

3. The method of claim 1, further comprising providing a drive-enable control signal to the boundary latch module, the drive-enable control signal enabling the boundary latch module to drive an output pin of the integrated circuit.

4. The method of claim 3, further comprising:
   (iv) capturing the drive-enable control signal in at least one of the plurality of latches; and
   (v) providing the drive-enable control signal as at least one input to a multiple-input signature register, the multiple-input signature register storing a signature of the integrated circuit resulting from the logic built-in self-testing.

5. The method of claim 1, wherein the plurality of selection devices comprises a plurality of multiplexers.

6. The method of claim 1, further comprising providing a switching device for controlling when the boundary latch module drives an output pin of the integrated circuit.

7. The method of claim 6, wherein the switching device comprises a tri-state buffer.

8. A system for controlling test data with a boundary latch module having a plurality of latches to facilitate testing an external signal path of an integrated circuit concurrently with logic built-in self testing of the integrated circuit, the system comprising:
   (i) a plurality of selection devices coupled to a plurality latches of a boundary latch module, the plurality of selection devices for selecting initialization data to store in the plurality of latches of the boundary latch module of the integrated circuit;
   (ii) means for utilizing the plurality of selection devices to select the initialization data from a plurality of scan paths of the integrated circuit;
   (iii) means for providing the initialization data from at least one of the plurality of latches as at least one output of the integrated circuit for testing at least one external signal path of the integrated circuit;
   (iv) another selection device in the another boundary latch module, the another selection device for selecting an external datum provided by an external input to the integrated circuit or a test-pattern datum from test-pattern generator logic of the integrated circuit;
   (v) means for utilizing the another selection device to select the external datum or the test-pattern datum as a datum for capture in at least one of the plurality of latches of the another boundary latch module; and
   (vi) means for providing the datum captured by the at least one of the plurality of latches of the another boundary latch module as at least one input to a multiple-input signature register, the multiple-input signature register storing a signature of the integrated circuit resulting from the logic built-in self-testing.

9. The system of claim 8, wherein test-pattern generator logic of the integrated circuit provides the initialization data to the plurality of scan paths.

10. The system of claim 8, further comprising means for providing a drive-enable control signal to the boundary latch module, the drive-enable control signal enabling the boundary latch module to drive an output pin of the integrated circuit.

11. The system of claim 10, further comprising:
    (iv) means for capturing the drive-enable control signal in at least one of the plurality of latches; and
    (v) means for providing the drive-enable control signal as at least one input to a multiple-input signature register, the multiple-input signature register storing a signature of the integrated circuit resulting from the logic built-in self-testing.

12. The system of claim 8, wherein the plurality of selection devices comprises a plurality of multiplexers.

13. The system of claim 8, further comprising a switching device for controlling when the boundary latch module drives an output pin of the integrated circuit.

14. The system of claim 13, wherein the switching device comprises a tri-state buffer.

15. At least one program storage device readable by a machine embodying at least one program of instructions executable by the machine to perform a method of controlling test data with a boundary latch module having a plurality of latches to facilitate testing an external signal path of an integrated circuit concurrently with logic built-in self testing of the integrated circuit, the method comprising:

(i) providing a plurality of selection devices coupled to a plurality latches of a boundary latch module, the plurality of selection devices for selecting initialization data to store in the plurality of latches of the boundary latch module of the integrated circuit;

(ii) utilizing the plurality of selection devices to select the initialization data from a plurality of scan paths of the integrated circuit;

(iii) providing the initialization data from at least one of the plurality of latches as at least one output of the integrated circuit for testing at least one external signal path of the integrated circuit;

(iv) providing another selection device in the another boundary latch module, the another selection device for selecting an external datum provided by an external input to the integrated circuit or a test-pattern datum from test-pattern generator logic of the integrated circuit;

(v) utilizing the another selection device to select the external datum or the test-pattern datum as a datum for capture in at least one of the plurality of latches of the another boundary latch module; and (vi) providing the datum captured by the at least one of the plurality of latches of the another boundary latch module as at least one input to a multiple-input signature register, the multiple-input signature register storing a signature of the integrated circuit resulting from the logic built-in self-testing.

* * * * *